United States Patent [19]
Stengel et al.

[11] Patent Number: 5,329,259
[45] Date of Patent: Jul. 12, 1994

[54] EFFICIENT AMPLITUDE/PHASE MODULATION AMPLIFIER

[75] Inventors: Robert E. Stengel, Ft. Lauderdale; Charles A. Backof, Coral Springs, both of Fla.

[73] Assignee: Motorola, Inc., Schaumburg, Ill.

[21] Appl. No.: 986,823

[22] Filed: Feb. 11, 1993

[51] Int. Cl.⁵ .............................................. H04L 27/36
[52] U.S. Cl. .................................... 332/103; 332/145; 375/39
[58] Field of Search ............... 332/103, 104, 105, 145, 332/151; 330/295, 124 R, 10; 375/39, 42, 67

[56] References Cited

U.S. PATENT DOCUMENTS

| | | | |
|---|---|---|---|
| 4,433,312 | 2/1984 | Kahn | 332/145 |
| 4,571,549 | 2/1986 | Lods et al. | 332/103 |
| 5,093,636 | 3/1992 | Higgins, Jr. et al. | 332/103 X |

Primary Examiner—Siegfried H. Grimm
Attorney, Agent, or Firm—Mansour M. Ghomeshi

[57] ABSTRACT

A high efficiency amplitude/phase modulation amplifier circuit (100) includes a first (102) and a second (106) high efficiency amplifier. These amplifiers (102 and 106) amplify two constant amplitude/phase modulated signals. A combiner (104) combines the output signals from the amplifiers (102) and (106) to produce a combined signal to a load (108). Two shunt elements (202 and 204) are included to prevent the reactive components of the combined signal from reaching the amplifiers (102) and (106). With no reactive components reflected back, the amplifiers (102) and (106) can remain non-linear even though they are used to amplify an amplitude/phase modulated signal which includes Amplitude Modulation (AM) components.

13 Claims, 4 Drawing Sheets

EFFICIENT AMPLITUDE/PHASE MODULATION AMPLIFIER

FIELD OF THE INVENTION

This invention is related in general to modulators and more specifically to quadrature amplitude modulators.

BACKGROUND OF THE INVENTION

Amplitude/phase modulation such as Quadrature amplitude modulation (QAM) combine amplitude and phase modulation to produce a higher information throughput for a given spectral bandwidth than is available by using phase or amplitude modulation alone. The spectrum efficiency is however gained through the detriment of power efficiency. Although the phase modulation in a QAM signal takes advantage of the high DC to RF power efficiency, the efficiency of the QAM signal is limited to that of the amplitude modulation amplifiers. As is known, amplitude modulation requires the use of linear power amplifier systems to preserve the information modulation in the carrier envelope. Linear amplifiers are notorious for their efficiency. For example, a single ended linear power amplifier (class AB) will have a maximum efficiency at a peak power of 37%. This efficiency decreases as the output power level decreases with the average efficiency being lower than the peak power efficiency. It can be seen that although QAM signals provide an improvement in spectral efficiency they are limited to the linear power amplifier efficiency of AM systems. It is therefore appreciated that a high efficiency QAM system is highly desired that would not suffer from the low efficiency of amplitude modulation linear amplifiers.

SUMMARY OF THE INVENTION

Briefly, in accordance with the present invention, a high efficiency amplitude/phase modulation amplifier circuit is disclosed. The amplifier circuit includes a first and a second amplifier for amplifying a first and a second phase modulated signal to produce a first and a second amplified signal, respectively. A combiner is used to combine the first and the second amplified signals to produce an amplified amplitude/phase modulated signal. The reactive component of the amplified signal is prevented from loading the first and second amplifier, hence rendering the circuit highly efficient.

DETAILED DESCRIPTION OF THE PREFERRED EMBODIMENT

Figure 1:
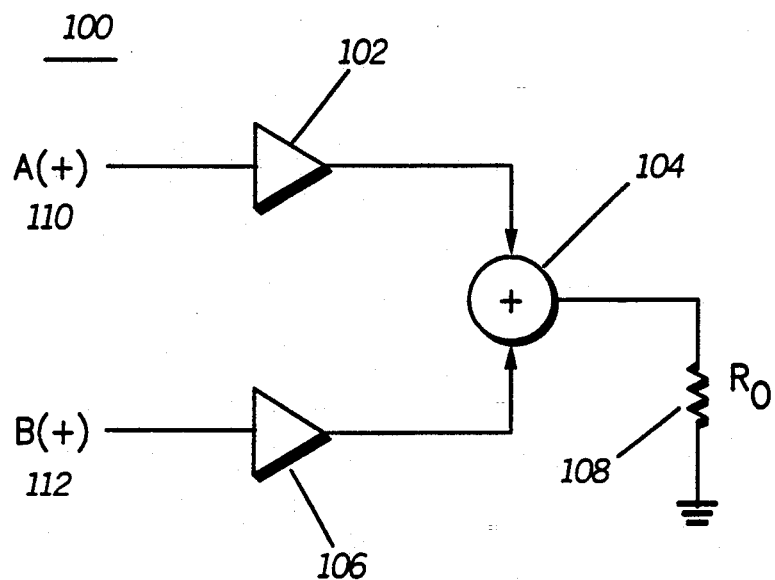
FIG. 1 is a block diagram of an amplifier circuit in accordance with the present invention.

Referring to FIG. 1, a block diagram of an amplifier circuit 100 in accordance with the present invention is shown. The amplifier circuit 100 includes amplifiers 102 and 106. These amplifiers may be any of well known constant output high efficiency amplifiers; such as class C or E. The input to amplifier 102 is:

$$V_1 = A(t)(\cos(wt + q_1(t)))$$

The input to amplifier 106 is:

$$V_2 = A(t)(\cos(wt + q_2(t)))$$

As can be seen, the two inputs have the same amplitude $A(t)$ and different time varying phase components $q_1(t)$ and $q_2(t)$. Each of these two phase components is carrying valuable information. The amplitude $A(t)$, however, does not carry any information. Indeed, constant output high efficiency amplifiers may be used in amplifiers 102 and 106 because of lack of information carried by the amplitudes of the input signals. Amplified signals at the output of amplifiers 102 and 106 are coupled to a combiner 104. The output of the combiner 104 is then coupled to a load 108. In the preferred embodiment, the combiner 104 is a transmission line impedance transformer and the load 108 is an antenna. The combiner 104 may be a summer that sums the two output signals of amplifiers 102 and 106 to produce an amplitude/phase modulated signal. In the preferred embodiment the signal produced is a QAM signal. It is understood that similar circuits may be used to produce a Single Side Band signal (SSB) or a high efficiency Amplitude Modulation (AM) signal.

Figure 2:
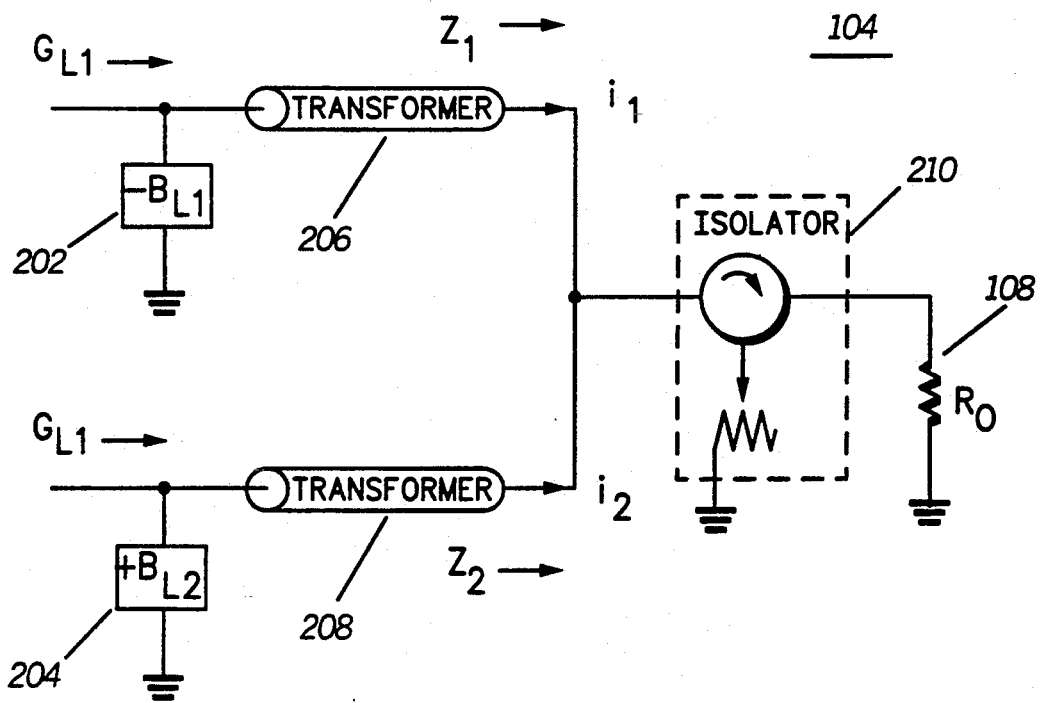
FIG. 2 is a block diagram of the components of a combiner in accordance with the present invention.

FIG. 2 shows a block diagram of the components of the combiner 104 in accordance with the present invention. The inputs are shunted with two reactive components 202 and 204. Two transformers 206 and 208 couple the inputs to an isolator 210. The output of the isolator 210 is shown coupled to the load 108. It is known in the art that loads; such as antennas, vary in impedance to some degree despite a desire otherwise. The variablity of the load 108 is handled via the isolator 210. The isolator 210 accomodates for some variation in the load 108 without allowing this variation to adversely affect the operation of the amplifier 100. In other words, the isolator 210 accommodates the variable load 108 to appear fixed to transformers 206 and 208. The isolator 210 provides the isolator means of the present invention and may be any of well known non-reciprocal impedance isolators, such as circulators.

It is noted that although the load 108 appears constant to the transformers 206 and 208 it is desired that it appear variable to the output of the amplifiers 102 and 106. The combiner 104 in combination with the phase relationship of the signals at the output of amplifiers 102 and 106 provide for a variable impedance to appear at the output of the amplifiers 102 and 106.

As stated, since the amplitude $A(t)$ in signals 110 and 112 does not carry any information the amplifiers 102 and 106 may be of the non-linear high efficiency type. In the preferred embodiment two high efficiency class E amplifiers are used.

The output of the combiner 104 is $$A(t)(\cos(wt+\theta_1(t))) + A(t)(\cos(wt+\theta_2(t)))$$

and using trigonometric identifies and replacing $q_1$ and $q_2$ with the relations in below, the following results $$2A(t)\cos\Phi(t)(\cos(\omega t+\theta(t)))$$

where $$\theta_1(t) = \theta(t) - \Phi(t)$$

$$\theta_2(t) = \theta(t) + \Phi(t)$$

For the purpose of our calculation it is assumed that $$2A(t)\cos\Phi(t) = B(t) \quad (1)$$

Note that $B(t)$ and $\theta(t)$ are the amplitude and phase modulation of the output signal. Now fix the amplitude of the two combined signal sources $A(t)$ as a constant in time at $A$. The output signal can be amplitude modulated with a phase modulation $+\Phi(t)$ and $-\Phi(t)$ on the combined fixed amplitude signals. In addition, the output can have a desired phase and amplitude modulation by adding an offsetting phase modulation $\Phi(t)$ about the desired $\theta(t)$ modulation. The result is an amplitude and phase modulation signal generated from combining two constant amplitude phase modulated only signals.

With respect to the load $R_o$ and the desired phase modulation $\theta(t)$ the currents $i_1$ and $i_2$ from FIG. 2 can be expressed in Cartesian form as:

$$i_1 = \frac{B(t)_{max}}{2R_0}[\cos\Phi(t) + j\sin\Phi(t)]$$

$$i_2 = \frac{B(t)_{max}}{2R_0}[\cos\Phi(t) + j\sin\Phi(t)]$$

applying the desired output voltage $B(t)$ $Z_1$ and $Z_2$ may be determined as follows $$Z_1 = \frac{B(t)}{i_1} = \frac{2R_oB(t)}{B(t)_{max}}[\cos\Phi(t) + j\sin\Phi(t)]$$

$$Z_2 = \frac{B(t)}{i_2} = \frac{2R_oB(t)}{B(t)_{max}}[\cos\Phi(t) + j\sin\Phi(t)]$$

The impedances $Z_1$ and $Z_2$ are transformed by the characteristic impedance of the quarter wave transmission lines 206 and 208 and the following relation with a 180 degree phase shift.

$$Y_{L1} = 1/Z_{L1} = Z_1/Z_o^2 = \frac{2R_o}{Z_o^2}\left(\frac{B(t)}{B(t)_{max}}\right)[\cos\Phi(t) + j\sin\Phi(t)] \quad (2)$$

$$Y_{L2} = 1/Z_{L2} = Z_2/Z_o^2 = \frac{2R_o}{Z_o^2}\left(\frac{B(t)}{B(t)_{max}}\right)[\cos\Phi(t) + j\sin\Phi(t)]$$

where $Z_o$ is the characteristic impedance of transformers 206 and 208. Using this relation and equation (1) with $B(t)_{max} = 2A(t)$, and normalizing to get the following:

$$Y_{L2} = (2R_o/Z_o^2)(V_r(V_r - j\sin(a\cos(V_r)))) = G_L + jB_L \quad (3)$$

$$V_r = \frac{B(t)}{B(t)_{max}}$$

Figure 3:
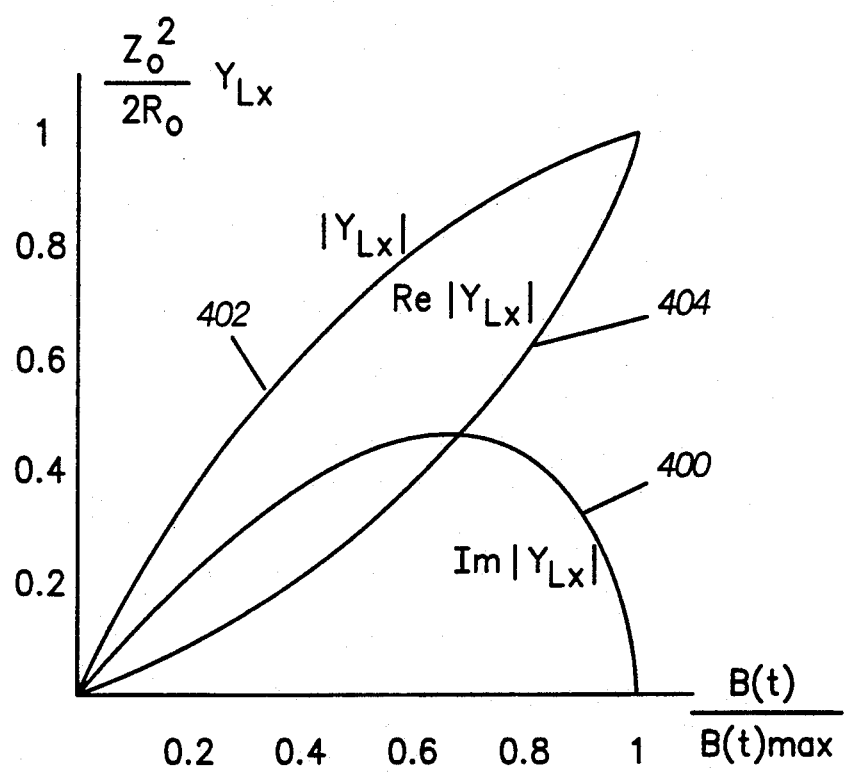
FIG. 3 is a plot of the load variation of the amplifier of FIG. 1 in accordance with the present invention.

FIG. 3 shows a plot of the above function with normalized magnitude 402, and real and imaginary values 404 and 406, respectively. This equation can be expressed in ratio terms of desired output voltage ($V_r$) or phase offset $\Phi(t)$ using equation (1) with $B(t)_{Max} = 2A(t)$.

$$Y_{L1} = \frac{2R_o}{Z_o^2}[\cos\Phi(t)(\cos\Phi(t) - j\sin\Phi(t))]$$

Using this and the expected range of output power, a shunt reactive value can be determined for compensating the combined reactance applied back to the power amplifier. FIG. 3 shows the added reactance of $XL = 1/B_L$ to offset the reactance as a result of the combined phase offset signals. This reactance could be a fixed value optimized for the expected output power range of operation, or a variable element as a function of the phase offset.

The two shunt elements 202 and 204 stop the reflection of the reactive components of the combined signal to reflect back to the amplifiers 102 and 106. In other words, the shunt elements 202 and 204 stop the dissipation of power in the reactive element that results when the two amplified signals are combined with a phase offset other than 0° or 180°. The minimum power dissipated in this reactive element results in the high efficiency operation of the circuit 100. It is understood that the two shunt elements 202 and 204 may take any one of several topologies. One such topology is an element between the two inputs of the transformers 206 and 208. Although the two shunt elements 202 and 204 optimize the efficiency of the combined output signal at a particular power level, it is understood that their values could be altered as a function of the phase offset to provide efficiency optimization at various output power levels. Using the normalized graphs of FIG. 3 one could determine the value of the shunt elements 202 and 204 at different power levels.

Now to get $P_{output}/P_{output\ Max}$ we must obtain the desired $V_{Lx}$ or $I_{Lx}$ and process them with $Z_{Lx}$ for the given amplifier class considered.

It is known that $$P_{output} = \frac{V_{Lx}^2}{Z_{Lx}} = i_{Lx}^2 Z_{Lx} \quad (4)$$

using the impedance transformer relation with the assumption of a lossless element, the following results, $$Z_o^2 = Z_x Z_{Lx} \text{ and } Z_x/Z_{Lx} = V_x^2/V_{Lx}^2$$

and $$V_{Lx} = (Y_{Lx}Z_o)(B(t)) \quad (5)$$

applying equations 2, 4, and 5 into equation 3, the following results:

$$P_{output} = [Y_{Lx}Z_oB(t)/2]^2[Y_{Lx}] = Y_{Lx}^3 Z_o^2 B(t)^2$$

Solving for $P_{output\ Max}$ $$P_{output} = \frac{B(t)^2_{max}}{R_O}$$

$$\frac{P_{output}}{P_{output\ Max}} = \left[\frac{B(t)^2}{B(t)^2 Max}\right][Y_{Lx}^3 R_O Z_o^2]$$

$$\frac{P_{output}}{P_{output\ Max}} = [\cos^2\Phi(t)][Y_{Lx}^3 R_O Z_o^2]$$

If the reactance elements 202 and 204 have infinite reactance or zero susceptance ($\text{Im}(Y_{Lx}) = B_{Lx} = 0$) then the above equation is reduced to $$\frac{P_{output}}{P_{output\,Max}} = R_O Z_O^2 [\cos\Phi(t)]^5 [\cos\Phi(t) - j\sin\Phi(t)]^3$$

These results indicate that the output of the amplifier 100 is composed of two components; a real power delivered to the resistance of the load 108 and a reactive power as a function of the amplifier phase offset. This reactive power will result in an efficiency reduction if reactive shunt elements 202 and 204 are not used. An appreciable efficiency improvement is realized in the amplifier 100 using the two reactive shunt elements 202 and 204.

Some class of amplifiers, such as class AB, when used as amplifiers 102 and 106 take special advantage of the characteristics of the combiner 104. In fact, the combiner 104 can be thought of rendering the load 108 variable to the amplifiers 102 and 106 for these classes of amplifiers. In other words, the load to which the amplifiers 102 and 106 source current is continuously changing via the combiner 104. The change in the load characteristic allows the amplifiers 102 and 106 to operate at their peak power with maximum efficiency.

Figure 4:
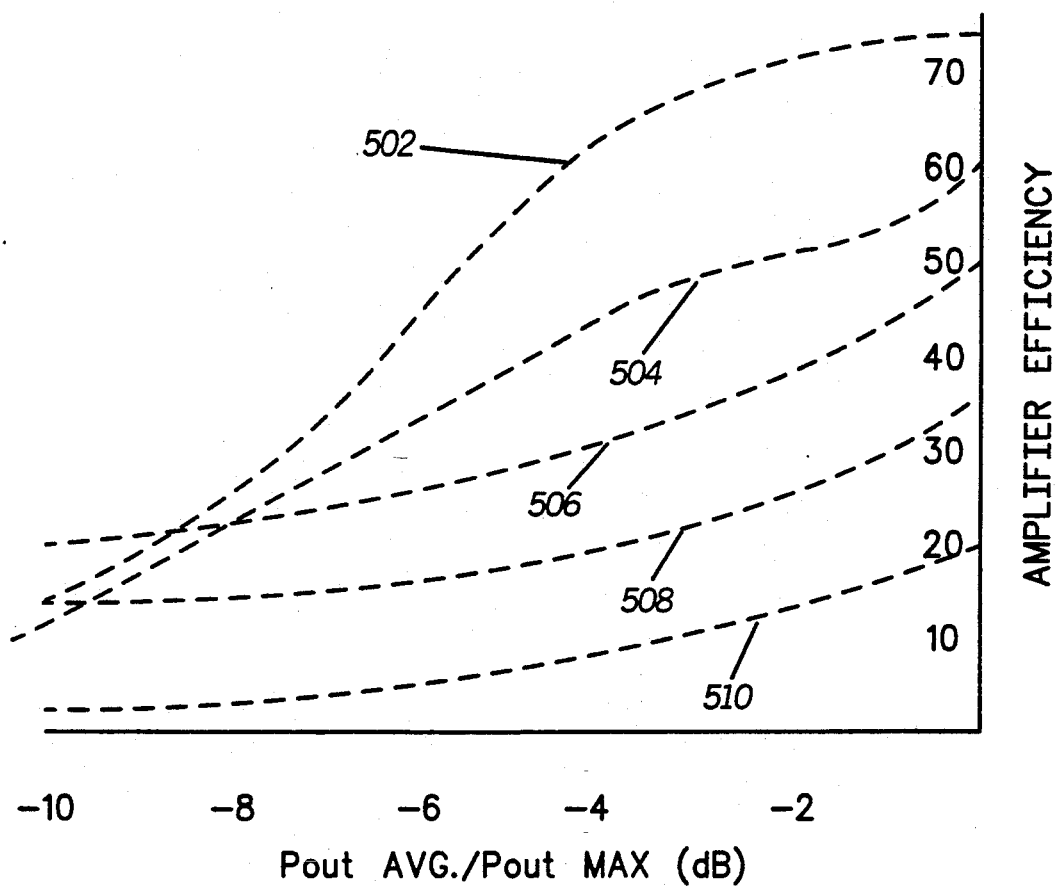
FIG. 4 shows a simulated plot of the efficiency performance of the amplifier in accordance with the present invention.

FIG. 4 shows a plot 502 of collector modulation of class E power amplifiers with a normalized shunt reactance $B_L = 0.08\Omega$. Also shown in FIG. 4 are plots 504, 506, 508, and 510. Plot 504 graphs the collector modulation of the class E power amplifiers without the shunt elements. Plots 506, 508, and 510 show the performance of linear class B, AB, and A power amplifiers, respectively. For linear amplifiers the efficiency is directly proportional to the output power level, therefore the average efficiency corresponds to the efficiency at the average output power level. For the non-linear phase combined class E power amplifier the power output efficiency relation is not proportional. This means that the average efficiency for the class E power amplifier is determined by applying the output power level distribution function against the efficiency output power level curve. The result may be an average efficiency that is different from the average power level efficiency. As can be seen the efficiency of the class E amplifier with the shunt elements is significantly better than the one without the shunt elements.

In summary, two phase modulated signals are amplified and combined to produce a QAM signal. By shifting the amplification to the front end and part of the modulation to the back we have achieved high efficiency amplification of an amplitude modulated signal. The amplifiers 102 and 106 do not have to be low efficiency linear amplifiers, as is required for amplitude modulated signals. In essence, the two step modulation is accomplished at two distinct points in the amplifier chain. The information is initially placed in the phase of two distinct signals to allow their non-linear amplification. Once amplified, the two signals are combined to produce a QAM signal. In effect, this technique allows the use of high efficiency non-linear amplifiers to amplify an amplitude modulated signal.

As opposed to present amplitude/phase modulation amplifiers, the signal of the present invention is not first produced then amplified. Such a method would limit the efficiency of the amplifier to those of linear amplifiers. The present invention allows fixed amplitude signals to be amplified using high efficiency amplifiers.

The amplified signals are then combined using a combiner. This combiner allows the information contained in the phase of one of the signals to be transfered to the amplitude, hence producing a high efficiency amplitude/phase modulated signal. It can be seen that the operation of an amplitude/phase modulated amplifier no longer has to depend on low efficiency AM amplifiers.

Figure 5:
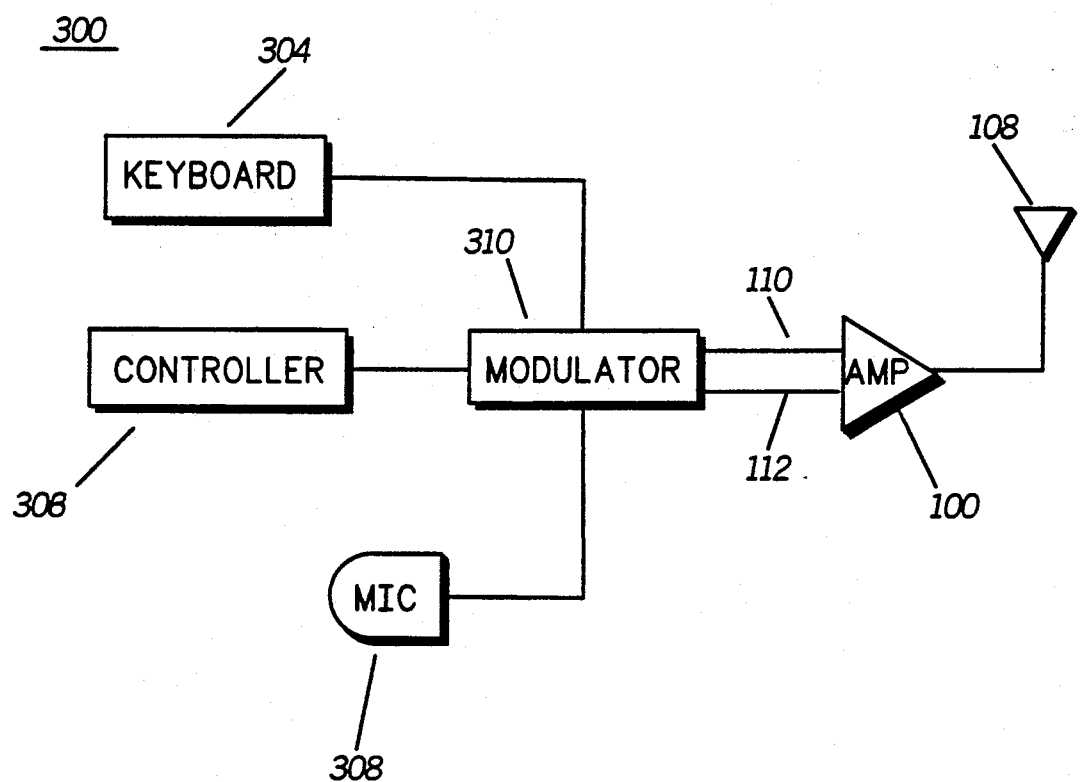
FIG. 5 is a block diagram of a communication device in accordance with the present invention.

Referring to FIG. 5 a block diagram of a communication device 300 in accordance with the present invention is shown. It is understood that the only elements shown here are those that are necessary to describe the principles of the present invention. The communication device 300 is prefereably a transmitter used for the transmission of QAM signals. A modulator 310 receives voice from a microphone 308. Keyboard information is coupled to the modulator 310 from a keyboard. The signals from the microphone 308 and the keyboard 304 are processed and used to phase modulate a carrier signal using well known phase modulation techniques. The two phase modulated signals 110 and 112 are coupled to the amplifier 100 where they are used to produce a QAM signal as described above. The output of the amplifier 100 is subsequently coupled to the antenna 108. A controller 306 is used to control the operation of the modulator 310 and other components of the device 300.

In summary, an amplitude/phase modulated signal is produced by first phase modulating the carrier signal with the two modulating signals to produce two distinct phase modulated signals having the same amplitude. These signals are individually amplified using non-linear switching amplifiers. These amplifiers can be used because the information is not yet contained in the amplitude. The two amplified signals are then combined in a combiner to produce the amplitude/phase modulated signal. The combiner shifts the information contained in the phase of one of the signals to the amplitude of the resultant signal. Using this method to produce an amplitude/phase modulated signal allows one to take full benefit of amplitude/phase modulated signals without the deficiencies of AM amplifiers.

What is claimed is:

1. An amplitude/phase modulation amplifier circuit coupled to a load, comprising:
    first amplifier for amplifying a first phase modulated signal to produce a first amplified signal;
    second amplifier for amplifying a second phase modulated signal to produce a second amplified signal;
    a combiner for combining the first and the second amplified signals with minimum reflection to produce a high efficiency amplified amplitude/phase modulated signal; and
    an isolator coupled to the combiner for maximizing efficiency.

2. The amplifier circuit of claim 1, wherein the first amplifier includes a constant output amplifier.

3. The amplifier circuit of claim 1, wherein the combiner includes an isolator for maximizing efficiency.

4. The amplifier circuit of claim 1, wherein the combiner includes a summer.

5. The amplifier circuit of claim 1, wherein the second amplifier includes a constant output amplifier.

6. A high efficiency amplitude/phase modulation amplifier circuit, comprising:
    a first amplifier for amplifying a first phase modulated signal, the first phase modulated signal having a fixed amplitude, a frequency, a fixed phase component, and a first variable phase component;

a second amplifier for amplifying a second phase modulated signal, the second phase modulated signal having the fixed amplitude, the frequency, and the fixed phase component of the first phase modulated signal along with a second variable phase component;

a combiner for combining the first and the second phase modulated signals to produce an amplified amplitude/phase modulated signal having a reactive component, the combiner having means for preventing the reactive component of the amplified amplitude/phase modulated signal from loading the first or the second amplifier; and an isolator for accommodating a variable load to appear fixed to the combiner in order to maximize the efficiency of the amplifier circuit.

7. The high efficiency amplifier circuit of claim 6, wherein the combiner includes a plurality of transformers.

8. The high efficiency amplifier circuit of claim 7, wherein the combiner includes an isolator for accommodating a variable load to appear fixed to the plurality of transformers in order to maximize the efficiency of the amplifier circuit.

9. The high efficiency amplifier circuit of claim 6, wherein the first and second amplifiers include class E amplifiers.

10. The high efficiency amplifier circuit of claim 6, wherein the first and second amplifiers include switching amplifiers.

11. A Quadrature Amplitude Modulation (QAM) transmitter, comprising:
an oscillator for generating a carrier signal;
a modulator for modulating the carrier signal to produce a first and a second phase modulated signal:
a QAM amplifier circuit, the amplifier circuit comprising:
first amplifier for amplifying the first phase modulated signal to produce a first amplified signal;
second amplifier for amplifying the second phase modulated signal to produce a second amplified signal;
a combiner for combining the first and the second amplified signals to produce an amplified QAM signal having a reactive component, the combiner having means for minimizing the reflection of the reactive component onto the first and second amplifiers in order to optimize efficiency; and
an isolator coupled to the combiner.

12. The transmitter of claim 11, further comprising an antenna coupled to the QAM amplifier for transmitting the amplified QAM signal.

13. The transmitter of claim 11, wherein the first and second amplifiers include class E amplifiers.

* * * * *